United States Patent
Lee et al.

(10) Patent No.: US 6,773,969 B2
(45) Date of Patent: Aug. 10, 2004

(54) METHOD OF FORMING A THIN FILM TRANSISTOR

(75) Inventors: Hsin-Hung Lee, Taipei (TW); I-Chang Tsao, Hsin-Chu (TW); Chih-Hung Su, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/249,218

(22) Filed: Mar. 24, 2003

(65) Prior Publication Data

US 2004/0119072 A1 Jun. 24, 2004

(30) Foreign Application Priority Data

Dec. 18, 2002 (TW) .......................................... 91136580 A

(51) Int. Cl.⁷ .......................... H01L 21/00; H01L 21/84
(52) U.S. Cl. ........................ 438/149; 438/151; 438/166
(58) Field of Search ................................. 438/149, 151, 438/166, 308, 487, 150; 257/59, 72

(56) References Cited

U.S. PATENT DOCUMENTS 6,504,175 B1 * 1/2003 Mei et al. ..................... 257/66

\* cited by examiner

*Primary Examiner*—Hoai Pham
(74) *Attorney, Agent, or Firm*—Winston Hsu

(57) ABSTRACT

A gate of a thin film transistor (TM is formed on a surface of a substrate. A gate insulating (GI) layer and an amorphous silicon layer are then sequentially formed on the gate. A dehydrogen treatment is performed thereafter, and a re-crystallizing process is performed to transform the amorphous silicon layer into a crystalline silicon layer. Then, a doped n⁺ layer is formed on the gate, and portions of the doped n⁺ layer and the crystalline silicon layer are removed thereafter. Finally, a source and a gate of the thin film transistor are formed on the gate, and a passivation layer Is formed to cover the source and the gate.

7 Claims, 10 Drawing Sheets

METHOD OF FORMING A THIN FILM TRANSISTOR

BACKGROUND OF INVENTION

1. Field of the Invention

The present invention relates to a method of forming a thin film transistor (TFT) of an organic light-emitting diode (OLED) display, and more specifically, to a method of forming a TFT comprising a crystalline silicon layer.

2. Description of the Prior Art

In various types of flat panel displays, since an organic light-emitting diode (OLED) display has many beneficial characteristics, such as having a spontaneous light source, a wide viewing angle, highresponse velocity, low power consumption, full-color, simpler structure, and a wide operating temperature, the OLED display has been used extensively in small and medium scale portable display fields.

Please refer to FIG.1 to FIG.4 of schematic views of forming a thin film transistor (TFT) of an OLED display according to the prior art. As shown in FIG.1, a gate 12, composed of copper (Cu), is formed on a substrate 10. By performing a plasma enhanced chemical vapor deposition (PECVD).process, a gate insulating (GI) layer 14, comprising silicon oxide ($SiO_x$), silicon nitride ($SiN_y$) orsilicon oxynitride (SiON), is formed on the gate 12. An amorphous silicon layer 16 and a dopedn$^+$ layer 18 are then sequentially formed on the GI layer 14.

As shown in FIG. 2, by performing a first photo-etching-process (PEP), portions of the dopedn$^+$ layer 18 and the amorphous silicon layer 16 are removed. Then, an indium tin oxide (ITO) layer 20 is formed on the substrate 10, and a second PEP is performed to remove portions of the ITO layer 20. As shown in FIG. 3, a metal layer 22, comprising tungsten (W), chromium (Cr), copper (Cu) or Molybdenum (Mo), is formed on the substrate 10, and a third PEP is performed to remove portions of the metal layer 22 and the dopedn$^+$ layer 18 to simultaneously form a source 24 and a drain 26 of the TFT on the substrate 10 and expose portions of the amorphous silicon layer 16 thereafter.

Finally, as shown in FIG. 4, a passivation layer 28, comprising silicon oxide or silicon nitride, is formed on the substrate 10, and a fourth PEP is performed to remove portions of the passivation layer 28 so as to finish the fabrication of the TFT of the OLED display according to the prior art.

However, the amorphous silicon layer 16 is composed of silicon molecules not crystallized and comprises numerous Si—H bonds and silicon dangling bonds. Therefore, mobility of electrons in the amorphous silicon layer 16 is reduced, causing electrons trapped in the amorphous silicon layer 16 and further penetrate into the GI layer 14 under a long-time operation of the TFT. As a result, a voltage stress on the TFT is generated, leading to an increased threshold voltage ($v_{th}$) and a reduced turn on current ($I_{on}$) of the TFT that seriously downgrade the display quality of the OLED display.

SUMMARY OF INVENTION

It is therefore a primary object of the present invention to provide a method of forming a thin film transistor (TFT) of an organic light-emitting diode (OLDE) display so as to prevent an increased threshold voltage ($V_{th}$) and a reduced turn on current ($I_{on}$) of the TFT that seriously downgrade the display quality of the OLED display.

According to the claimed Invention, the TFT is formed on a substrate. At the beginning of the invention, a first metal layer Is deposited on the substrate, and a first photo-etching-process (PEP) is then performed on the first metal layer to form a gate of the TFT on the substrate. A gate insulating (GI) layer and a first amorphous silicon layer is sequentially formed on the gate thereafter. By performing a dehydrogen treatment, hydrogen atoms in the first amorphous silicon layer is removed. A re-crystallizing process is then performed to transfer the first amorphous silicon layer into a crystalline silicon layer, and a second amorphous silicon layer and a dopedn$^+$ layer are sequentially formed on the gate thereafter. By performing a second PEP, portions of the dopedn$^+$ layer, the second amorphous silicon layer and the crystalline silicon layer are removed. Then, a second metal layer is formed on the substrate, and a third PEP is performed to form a source and a drain of the TFT and to simultaneously remove portions of the dopedn$^+$ layer to expose portions of the second amorphous silicon layer. Finally, a passivation layer is formed to cover the source and the drain.

It is an advantage of the present invention against the prior art that the dehydrogen treatment is performed to remove hydrogen atoms in the first amorphous silicon layer, and the re-crystallizing process is then performed to transfer the first amorphous silicon layer into the crystalline silicon layer. Then, the Si-H bonds and silicon dangling bonds in the crystalline silicon layer are erased, and the grain sizes of silicon molecules in the crystalline silicon layer are increased. Mobility of electrons in the crystalline silicon layer is therefore improved, preventing electrons from being trapped in the crystalline silicon layer and further penetrating into the GI layer. As a result, an increased threshold voltage ($V_{th}$) of the TFT caused by voltage stress are prevented, even under a long-time operation of the TFT. Consequently, a constant turn on current ($I_{on}$) of the TFT is assured, leading to a stable display quality of the OLED display.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
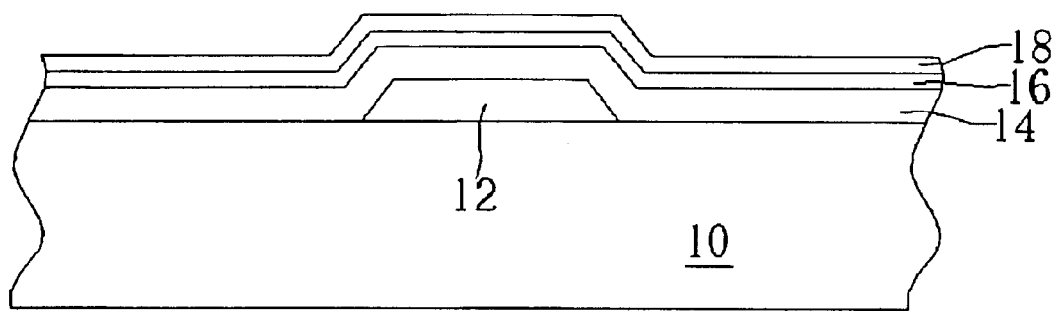
FIG. 1 to FIG. 4 are schematic views of forming a thin film transistor (TFT) of an organic light-emitting diode (OLED) display according to the prior art.
Figure 2:
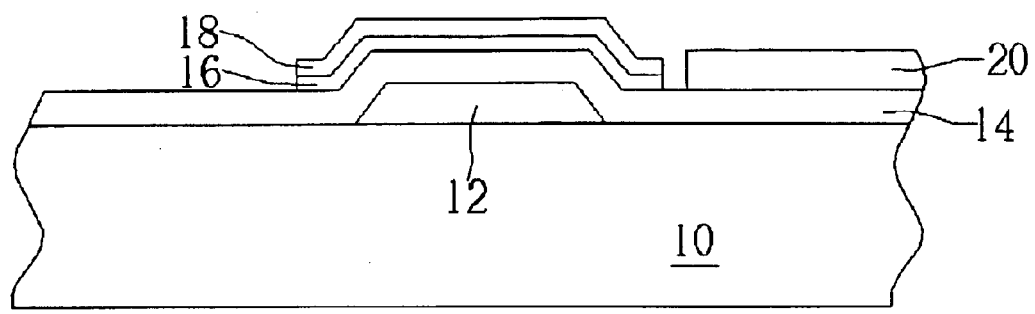
Figure 3:
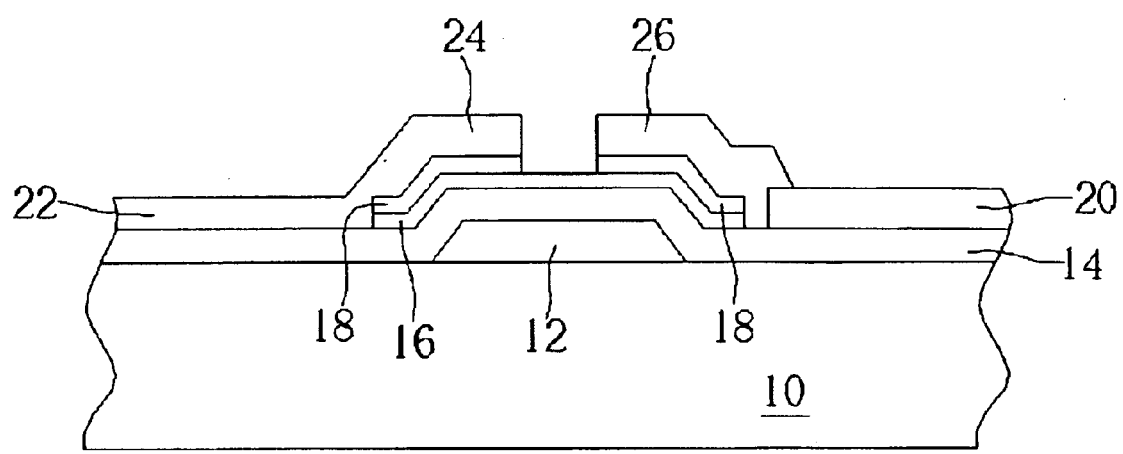
Figure 4:
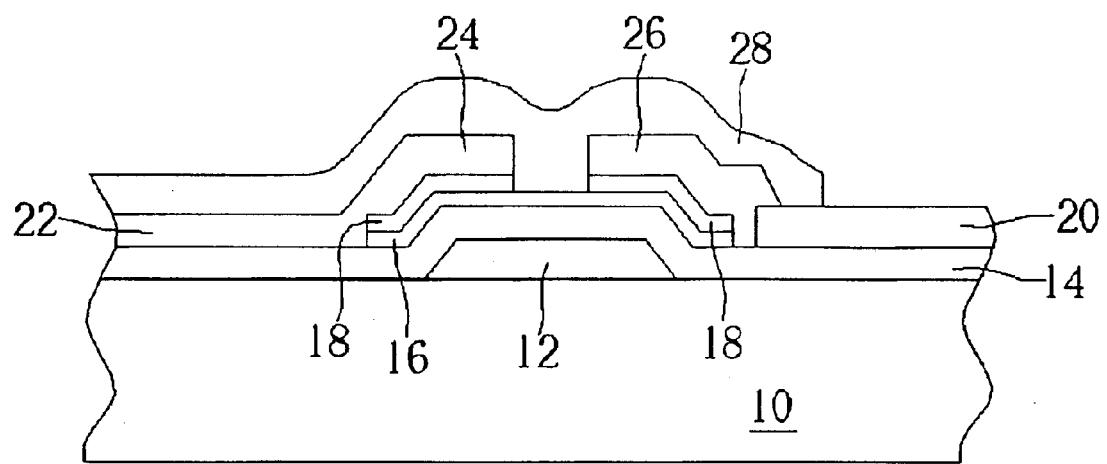
Figure 5:
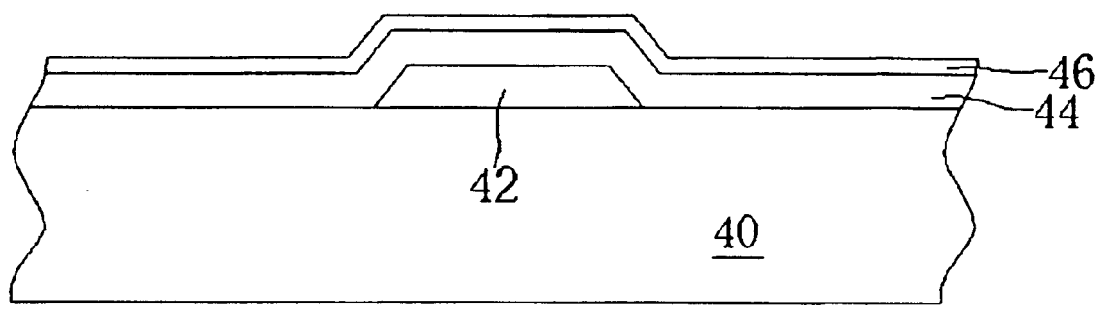
FIG. 5 to FIG. 9 are schematic views of forming a TFT of an OLED display according to the present invention.

Please refer to FIG. 5 to FIG. 9 of schematic views of forming a thin film transistor (TFT) of an organic light-emitting diode (OLED) display according to the present invention. As shown in FIG. 5, a gate 42 is formed on a substrate 40. Generally, the substrate 40 is either one of a glass substrate, a quartz substrate or a plastic substrate, and the gate 42 comprises tungsten (W), chromium (Cr), copper (Cu) or Molybdenum (Mo). At the beginning of the method, a plasma enhanced chemical vapor deposition (PECVD) process is performed to deposit a gate insulating (GI) layer 44, comprising silicon oxide ($SiO_x$), silicon nitride ($SiN_y$) or silicon oxynitride (SiON), on the gate 42. A first amorphous silicon layer 46 is then formed on the GI layer 44.

Figure 6:
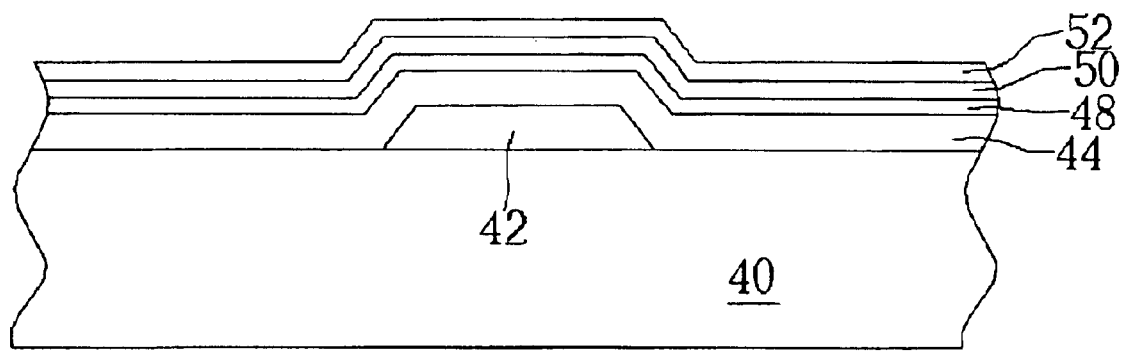

As shown in FIG. 6, a dehydrogen treatment, having a duration of approximately one hour, is then performed to remove hydrogen atoms in the first amorphous silicon layer 46 in a high-temperature partial-vacuum chamber (not shown). A re-crystallizing process is performed thereafter to transfer the first amorphous silicon layer 46 into a crystalline silicon layer 48. In the preferred embodiment of the present invention, the re-crystallizing process Is a laser annealing re-crystallizing process utilizing a laser beam (not shown), and the crystalline silicon layer 48 is a micro-crystalline silicon layer. A second amorphous silicon layer 50 is then formed on the gate 42, and a dopedn+ layer 52 is formed to cover the second amorphous silicon layer 50 thereafter.

Figure 7:
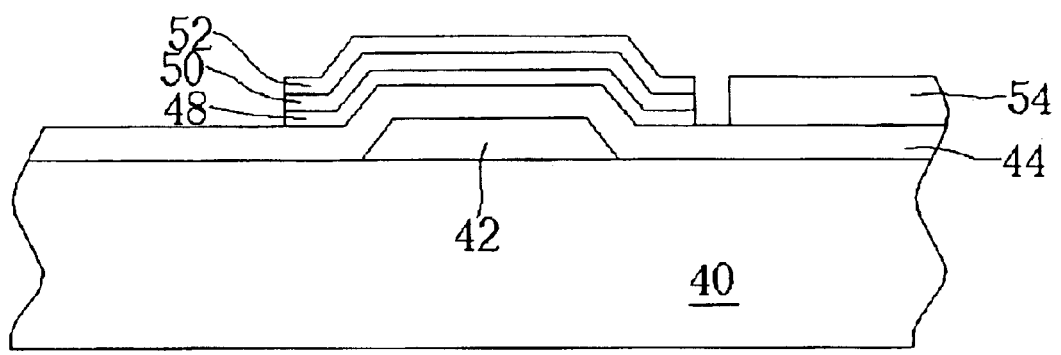
Figure 8:
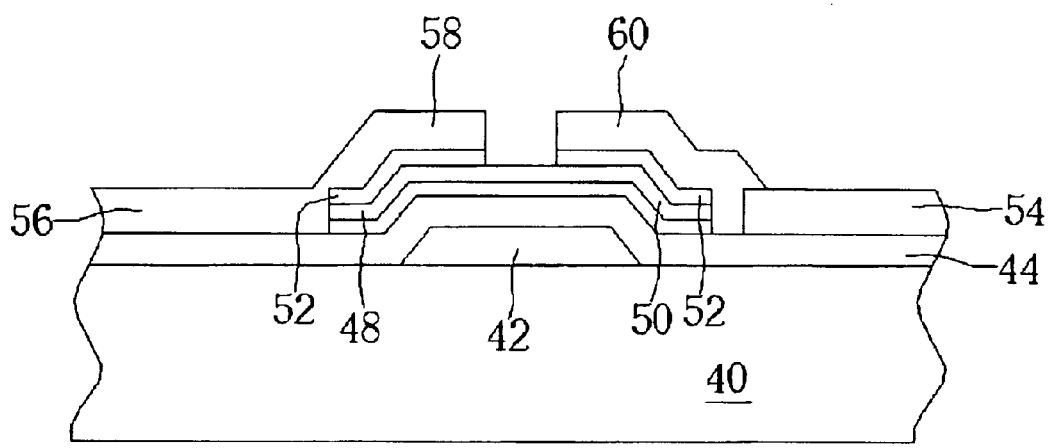

As shown in FIG. 7, by performing a first photo-etching-process (PEP), portions of the n+ layer 52, the second amorphous silicon layer 50 and the crystalline silicon layer 48 are remove. Then, an indium tin oxide (ITO) layer 54 is formed on the substrate 40, and a second PEP is performed to remove portions of the ITO layer 54. As shown in FIG. 8, a metal layer 56, comprising W, Cr, Cu or Mo, is then formed on the substrate 40. A third PEP is performed thereafter to remove portions of the metal layer 56 and the dopedn+ layer 52 to simultaneously form a source 58 and a drain 60 of the TFT and expose portions of the second amorphous silicon layer 50.

Figure 9:
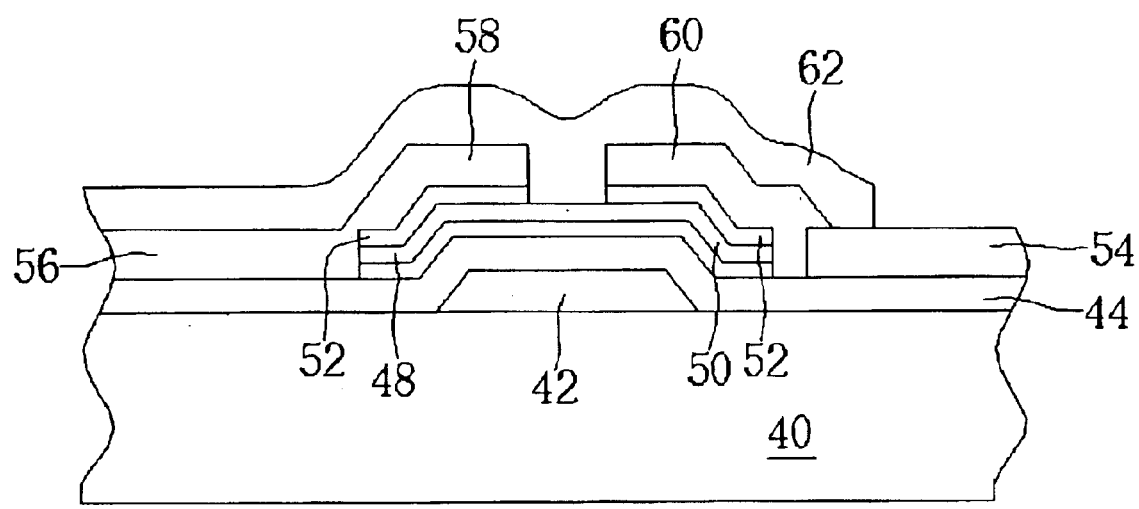

Finally, as shown in FIG. 9, a passivation layer 62, comprising silicon oxide or silicon nitride, is formed on the substrate 40, and a fourth PEP is performed to remove portions of the passivation layer 62 so as to finish the fabrication of the TFT of the OLED display.

Figure 10:
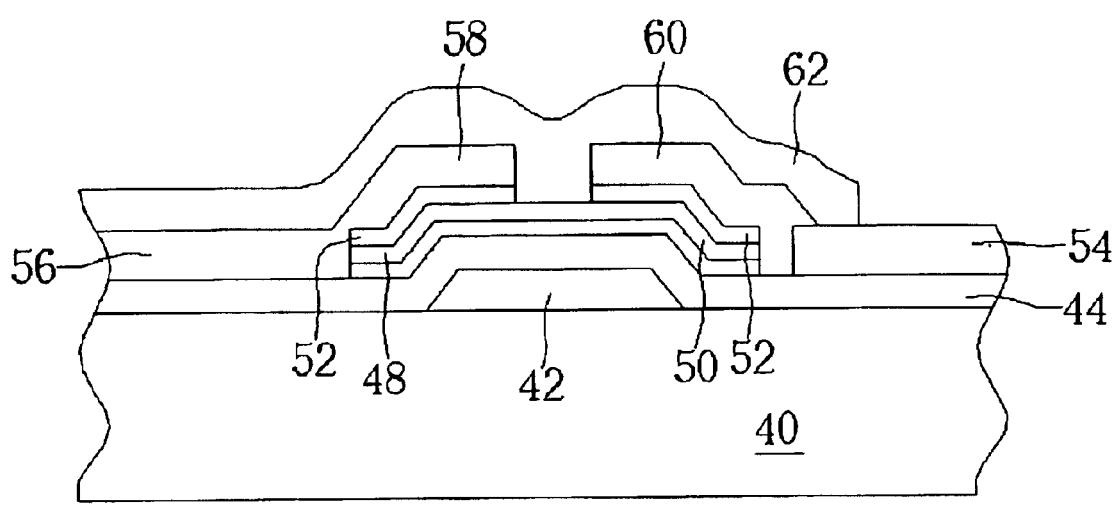
FIG. 10 is the schematic view of a TFT of an OLED display according to another embodiment of the present invention.

Please refer to FIG. 10 of a schematic view of a TFT of an OLED display according to another embodiment of the present invention. Alternatively, as shown in FIG. 10, the second amorphous silicon layer 50 can be neglected due to product requirement. The fabricating procedures of the TFT shown in FIG. 10 are similar to those of the TFT shown in FIG. 5 to FIG. 9 and are therefore omitted for simplicity of description.

In comparison with the prior art, the present invention utilizes the dehydrogen treatment to remove hydrogen atoms in the first amorphous silicon layer 46, and the re-crystallizing process is then performed to transfer the first amorphous silicon layer 46 into the crystalline silicon layer 48. Then, the Si-H bonds and silicon dangling bonds in the crystalline silicon layer 48 are erased, and the grain sizes of silicon molecules in the crystalline silicon layer 48 are increased. Mobility of electrons in the crystalline silicon layer 48 is therefore improved, preventing electrons from being trapped In the crystalline silicon layer 48 and further penetrating into the GI layer 44.

As a result, an increased threshold voltage ($V_{th}$) of the TFT caused by voltage stress are prevented, even under a long-time operation of the TFT. Consequently, a constant turn on current ($I_{on}$) of the TFT is assured, leading to a stable display quality of the OLED display.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming a thin film transistor (TFT) of an organic light-emitting diode (OLED) display comprising:

providing a substrate;

depositing a first metal layer on the substrate;

performing a first photo-etching-process (PEP) on the first metal layer to form a gate of the TFT on the substrate;

sequentially forming a gate insulating (GI) layer and a first amorphous silicon layer on the gate;

performing a re-crystallizing process to transfer the first amorphous silicon layer into a crystalline silicon layer;

forming a second amorphous silicon layer on the gate;

forming a doped n+ layer on the gate;

performing a second PEP to remove portions of the n+ layer, the second amorphous silicon layer and the crystalline silicon layer;

forming a second metal layer on the gate;

performing a third PEP to form a source and a drain of the TFT on the substrate and to simultaneously remove portions of the n+ layer; and forming a passivation layer on the substrate.

2. The method of claim 1 wherein the substrate comprises a glass substrate, a quartz substrate or a plastic substrate.

3. The method of claim 1 wherein either the first metal layer or the second metal layer comprises tungsten (w), chromium (Cr), copper (Cu) or molybdenum (Mo).

4. The method of claim 1 wherein the GI layer comprises silicon oxide ($SiO_x$), silicon nitride($SiN_y$) or silicon oxynitride (SiON), and the passivation layer comprises silicon oxide or silicon nitride.

5. The method of claim 4 wherein the GI layer is formed by performing a plasma-enhanced chemical vapor deposition (PECVD) process.

6. The method of claim 1 wherein the re-crystallizing process comprises a laser annealing re-crystallizing process.

7. The method of claim 1 wherein the crystalline silicon layer comprises a micro-crystalline silicon layer.

* * * * *